(12) United States Patent
Furukawa et al.

(10) Patent No.: US 9,887,092 B2
(45) Date of Patent: Feb. 6, 2018

(54) ETCHING METHOD, ETCHING APPARATUS, AND STORAGE MEDIUM

(71) Applicant: Tokyo Electron Limited, Tokyo (JP)

(72) Inventors: Takahiro Furukawa, Kumamoto (JP); Yusuke Futamata, Kumamoto (JP); Hideaki Sato, Kumamoto (JP); Hiromi Hara, Kumamoto (JP); Takahiro Kawazu, Kumamoto (JP); Toshiyuki Shiokawa, Kumamoto (JP); Takami Satoh, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/024,084

(22) PCT Filed: Sep. 19, 2014

(86) PCT No.: PCT/JP2014/074875
§ 371 (c)(1),
(2) Date: Mar. 23, 2016

(87) PCT Pub. No.: WO2015/046067
PCT Pub. Date: Apr. 2, 2015

(65) Prior Publication Data
US 2016/0233106 A1    Aug. 11, 2016

(30) Foreign Application Priority Data

Sep. 27, 2013   (JP) ................................. 2013-202325

(51) Int. Cl.
*H01L 21/302*   (2006.01)
*H01L 21/306*   (2006.01)
(Continued)

(52) U.S. Cl.
CPC .. *H01L 21/30604* (2013.01); *H01L 21/31111* (2013.01); *H01L 21/67086* (2013.01)

(58) Field of Classification Search
CPC ........... H01L 21/6708; H01L 21/67086; H01L 21/30604; H01L 21/31111; H01L 21/67109; H01L 21/30617; C23C 2/04
(Continued)

(56) References Cited

U.S. PATENT DOCUMENTS

2008/0035609 A1*  2/2008  Kashkoush ....... H01L 21/31111
                                                    216/84
2009/0246968 A1* 10/2009  Nakajima ............... B08B 3/048
                                                    438/745
(Continued)

FOREIGN PATENT DOCUMENTS

JP      03-020895 A    1/1991
JP      07-086231      3/1995
(Continued)

OTHER PUBLICATIONS

International Search Report dated Dec. 22, 2014 for WO 2015/046067 A1.

*Primary Examiner* — Lan Vinh
(74) *Attorney, Agent, or Firm* — Abelman Frayne & Schwab (57) ABSTRACT

Provided is an etching method including: an etching step of performing an etching processing using an etching liquid on a workpiece accommodated in an etching processing unit; and an interval step between the etching step on the workpiece and a next etching step on another workpiece. The etching step includes a first partial replacement pattern including discharging the etching liquid in the etching processing unit provided for the etching processing by a first set amount, and supplying a new etching liquid into the etching processing unit by a second set amount, and the interval step includes a second partial replacement pattern including discharging the etching liquid in the etching processing unit provided for the etching processing by a
(Continued)

third set amount, and supplying a new etching liquid into the etching processing unit by a fourth set amount.

13 Claims, 5 Drawing Sheets

(51) Int. Cl.
*H01L 21/311* (2006.01)
*H01L 21/67* (2006.01)

(58) Field of Classification Search
USPC .............. 438/745, 747, 749, 751; 156/345.1, 156/345.11, 345.17, 345.21
See application file for complete search history.

(56) References Cited

U.S. PATENT DOCUMENTS

2010/0136716 A1* 6/2010 Okuchi ............. H01L 21/67086
    438/14
2010/0210110 A1* 8/2010 Okuchi ............. H01L 21/31111
    438/694

FOREIGN PATENT DOCUMENTS

| JP | 2001-023952 A | 1/2001 |
| JP | 2003-342377 A | 12/2003 |
| JP | 2011-119610 A | 6/2011 |

* cited by examiner

RELATIONSHIP BETWEEN DISCHARGE AMOUNT AND SUPPLY AMOUNT

| ETCHING STEP 150min | DISCHARGE AMOUNT | 0.05L/min |
| | DISCHARGE AMOUNT | 0.05L/min |
| INTERVAL STEP 1min | DISCHARGE AMOUNT | 0.5L/min |
| | DISCHARGE AMOUNT | 0.5L/min |

ETCHING METHOD, ETCHING APPARATUS, AND STORAGE MEDIUM

CROSS-REFERENCE TO RELATED APPLICATIONS

This application is a national phase of PCT application No. PCT/JP2014/074875, filed on 19 Sep. 2014, which claims priority from Japanese patent application No. 2013-202325, filed on 27 Sep. 2013, all of which are incorporated herein by reference.

TECHNICAL FIELD

The present disclosure relates to an etching method, an etching apparatus, and a storage medium. Particularly, the present disclosure relates to an etching method, an etching apparatus, and a storage medium for performing an etching processing with an etching liquid, on a workpiece such as, for example, a semiconductor wafer.

BACKGROUND

Conventionally, in a wet etching method for a workpiece such as, for example, a semiconductor wafer, an etching processing has been performed on a nitride film-oxide film by using phosphoric acid as an etching liquid. For example, an etching processing is performed on a workpiece such as, for example, a semiconductor wafer (hereinafter, referred to as a "wafer") by heating an etching liquid composed of, for example, a phosphoric acid aqueous solution ($H_3PO_4$), which is stored in a processing bath, to a predetermined temperature, for example, 160° C. to 180° C., and circularly supplying the etching liquid of the predetermined temperature through a circulation line connected to the processing bath, and a circulation pump, and a temperature controller interposed in the circulation line (see, e.g., Japanese Patent Publication No. 3-20895).

In the etching method, when the etching processing is performed repeatedly, the silicon (Si) component of the wafer is eluted into the etching liquid, and the silicon (Si) concentration in the etching liquid is increased. Thus, the etching processing may not be performed precisely on the semiconductor wafer. Therefore, conventionally, it has been necessary to completely replace the etching liquid in the processing bath regularly.

However, when the etching liquid in the processing bath is completely replaced with a new etching liquid, the silicon concentration in the etching liquid is temporarily reduced. However, the lowered silicon concentration in the etching liquid is not a good thing, and maintaining the silicon concentration within a determined constant range enables the etching processing to be performed precisely on the semiconductor wafer.

In addition, when the etching liquid in the processing bath is completely replaced regularly, it is necessary to perform a liquid adjustment such as, for example, an adjustment of a silicon concentration of the new etching liquid by, for example, seasoning whenever the etching liquid is replaced. In this case, the liquid adjustment becomes complicated, and the processing time is increased as well.

PRIOR ART DOCUMENT

Patent Document

Patent Document 1: Japanese Patent Publication No. 03-020895

DISCLOSURE OF THE INVENTION

Problems to be Solved

The present disclosure has been made in consideration of the above circumstance, and an object of the present disclosure is to provide an etching method, an etching apparatus, and a storage medium, for performing an etching processing precisely on a semiconductor wafer, by easily and simply maintaining a concentration of an elution component in an etching liquid eluted from the semiconductor wafer (silicon concentration) constant, without completely replacing the etching liquid.

Means to Solve the Problems

The present disclosure provides an etching method including: an etching step of performing an etching processing using an etching liquid on a workpiece accommodated in an etching processing unit; and an interval step between the etching step on the workpiece and a next etching step on another workpiece. The etching step includes a first partial replacement pattern including discharging the etching liquid in the etching processing unit provided for the etching processing by a first set amount, and supplying a new etching liquid into the etching processing unit by a second set amount. The interval step includes a second partial replacement pattern including discharging the etching liquid in the etching processing unit provided for the etching processing by a third set amount, and supplying a new etching liquid into the etching processing unit by a fourth set amount.

The present disclosure provides an etching apparatus for performing an etching processing on a workpiece. The etching apparatus includes: an etching processing unit configured to accommodate the workpiece and perform the etching processing with an etching liquid; a discharge unit configured to discharge the etching liquid provided for the etching processing in the etching processing unit; a supply unit configured to supply a new etching liquid to the etching processing unit; and a controller configured to control driving of the etching processing unit, the discharge unit, and the supply unit to thereby perform an etching method. The etching method, which is performed by the controller, includes: an etching step of performing an etching processing using an etching liquid on a workpiece accommodated in an etching processing unit; and an interval step between the etching step on the workpiece and a next etching step on another workpiece. The etching step includes a first partial replacement pattern including discharging the etching liquid in the etching processing unit provided for the etching processing by a first set amount, and supplying a new etching liquid into the etching processing unit by a second set amount. The interval step includes a second partial replacement pattern including discharging the etching liquid in the etching processing unit provided for the etching processing by a third set amount, and supplying a new etching liquid into the etching processing unit by a fourth set amount.

The present disclosure provides a non-transitory computer-readable storage medium that stores a computer program for performing an etching method. The etching method, which is performed by the controller, includes: an etching step of performing an etching processing using an etching liquid on a workpiece accommodated in an etching processing unit; and an interval step between the etching step on the workpiece and a next etching step on another workpiece. The etching step includes a first partial replacement pattern including discharging the etching liquid in the etching processing unit provided for the etching processing by a first set amount, and supplying a new etching liquid into the etching processing unit by a second set amount. The interval step includes a second partial replacement pattern including discharging the etching liquid in the etching processing unit provided for the etching processing by a third set amount, and supplying a new etching liquid into the etching processing unit by a fourth set amount.

Effect of the Invention

According to the present disclosure described above, the concentration of the elution component in an etching liquid eluted from the workpiece may be easily and simply maintained within a certain determined range, without completely replacing the etching liquid. Thus, the etching processing may be performed precisely on the workpiece.

DETAILED DESCRIPTION TO EXECUTE THE INVENTION

Exemplary Embodiment

Next, an exemplary embodiment of the present disclosure will be described with reference to FIGS. 1 to 6.

First, referring to FIG. 6(a) and FIG. 6(b), descriptions will be made on a workpiece, for example, a silicon wafer W, which is processed by the etching method according to the present disclosure.

As illustrated in FIG. 6(a) and FIG. 6(b), a wafer is first prepared by laminating a silicon oxide film 2 ($SiO_2$) and a silicon nitride film 3 ($Si_4N_3$) as base layers on the surface of a workpiece, for example, a silicon substrate 1, which is a base material of the wafer W, and coating a patterned resist film 4 on the surface of the silicon nitride film 3 (FIG. 6(a)). Next, an etching processing is performed by immersing the wafer W in an etching liquid, for example, a phosphoric acid aqueous solution ($H_3PO_4$) at an elevated temperature of, for example, 160° C. to 180° C. (FIG. 6(b)). In the etching method, it is important to suppress an etching rate of the silicon oxide film 2 underlying the silicon nitride film 3 by etching the silicon nitride film 3.

The etching method of the present disclosure is to perform an etching processing on such a wafer W. First, an etching apparatus for performing the etching method will be described.

Figure 1:
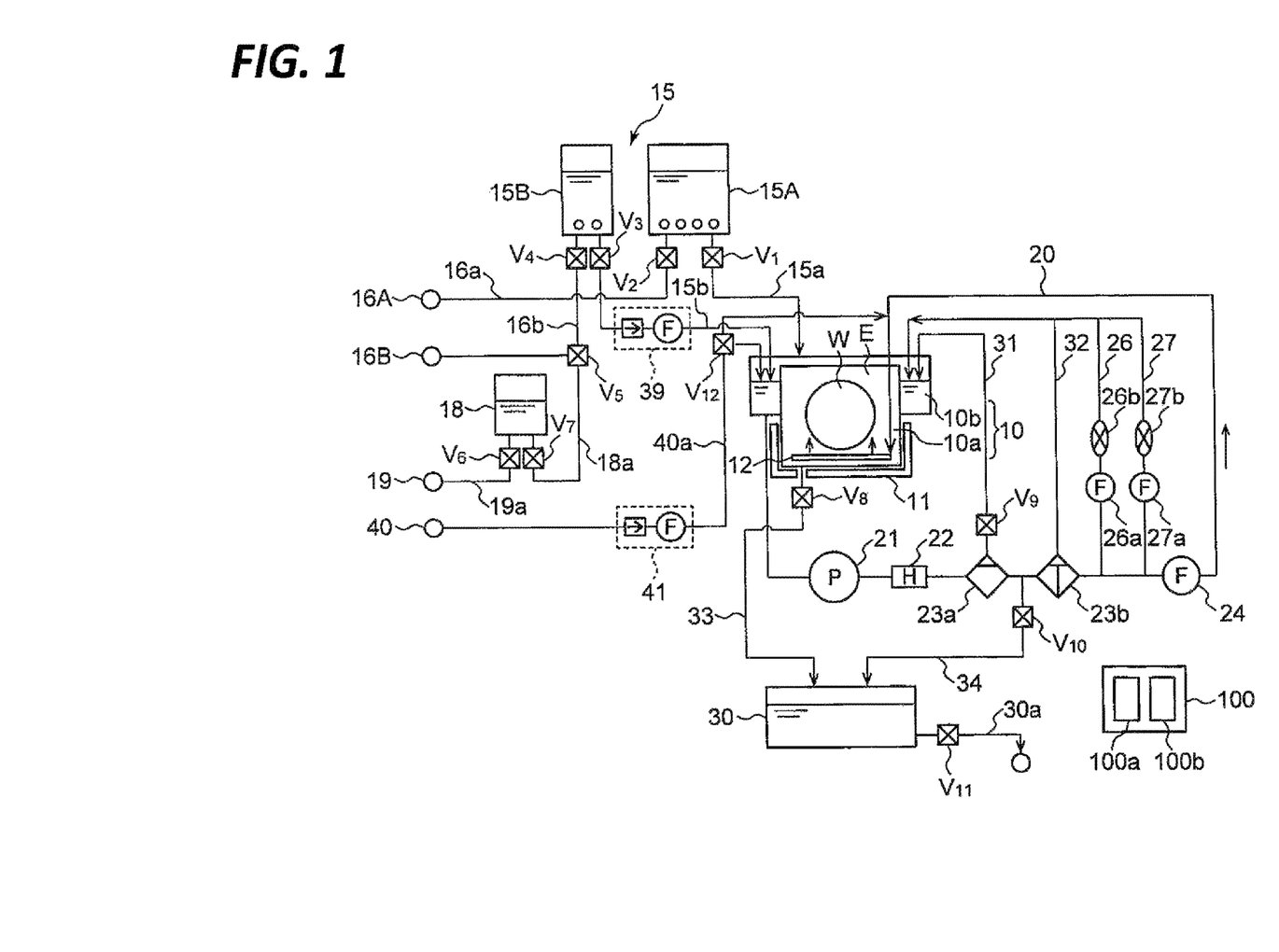
FIG. 1 is a schematic view illustrating an etching apparatus according to an exemplary embodiment of the present disclosure.

As illustrated in FIG. 1, the etching apparatus includes: a processing bath (etching processing unit) 10 that includes an inner bath 10a and an outer bath 10b and stores an etching liquid E (e.g., a phosphoric acid aqueous solution ($H_3PO_4$)) while accommodating a semiconductor wafer W (hereinafter, referred to as a "wafer W") serving as a workpiece; a circulation line 20 that takes out the etching liquid E from the outer bath 10b of the processing bath 10 and circularly supplies the etching liquid E to the processing bath 10; a discharge unit (cooling tank) 30 connected to the circulation line 20 to discharge the etching liquid E in the processing bath 10; and a supply unit 15 that supplies a new etching liquid E into the processing bath 10.

In this case, the processing bath 10 is constituted by the quartz-made inner bath 10a that stores the etching liquid E while accommodating the wafer W of which the surface is held vertically by a wafer boat (not illustrated), and the quartz-made outer bath 10b that receives the etching liquid E overflowing from the inner bath 10a. A panel heater 11 is attached to the lateral portion and the bottom portion of the inner bath 10a of the processing bath 10 configured as described above such that the etching liquid E in the processing bath 10 is set at a predetermined temperature, for example, 100° C. to 180° C. Further, a nozzle 12, which is connected to the circulation line 20, is provided at the bottom portion side in the inner bath 10. The etching liquid E circularly supplied from the circulation line 20 is uniformly sent to the inner bath 10 by the nozzle 12.

Further, the circulation line 20 is connected to the nozzle 12 provided in the lower portion of the outer bath 10b and within the inner bath 10a of the processing bath 10. The circulation line 20 is provided with a circulation pump 21, a temperature controller 22, a filter 23a, a filter 23b, and a flow rate meter 24 sequentially from the upstream side. The temperature controller 22 includes a heater that heats the etching liquid E.

Next, the supply unit 15 will be described. The supply unit 15 includes two etching liquid tanks 15A and 15B that accommodate and supply the phosphoric acid aqueous solution ($H_3PO_4$ aqueous solution). Above all, the etching liquid tank 15A accommodates a phosphoric acid aqueous solution having a high Si concentration (a silicon concentration within a range determined in advance to precisely perform an etching processing on the semiconductor wafer), and includes a heater (not illustrated). Further, the etching liquid tank 15B accommodates a phosphoric acid aqueous solution having a low Si concentration (a silicon concentration that is zero (0) or lower than the high silicon concentration of the etching liquid tank 15A), and includes a heater (not illustrated).

The etching liquid tank 15A is connected with a high-Si-concentration phosphoric acid aqueous solution source 16A that supplies the high-Si-concentration phosphoric acid aqueous solution, via a connection line 16a provided with a valve $V_2$. The etching liquid tank 15B is connected with a low-Si-concentration phosphoric acid aqueous solution source 16B that supplies the low-Si-concentration phosphoric acid aqueous solution, via a connection line 16b provided with a valve $V_5$.

In this case, the low-Si-concentration phosphoric acid aqueous solution source 16B supplies the low-Si-concentration phosphoric acid aqueous solution, and the high-Siconcentration phosphoric acid aqueous solution source 16A supplies the high-Si-concentration phosphoric acid aqueous solution.

Further, a Si solution tank 18 is provided to accommodate a Si solution. The Si solution tank 18 is connected with a Si solution source 19 via a connection line 19a provided with a valve $V_6$. Further, the Si solution tank 18 is connected with a connection line 18a provided with a valve $V_7$, and the connection line 18a is connected to the connection line 16b via the valve $V_5$.

Further, the etching liquid in the etching liquid tank 15A is supplied to the inner bath 10a of the processing bath 10 via a connection line 15a provided with a valve $V_1$. Further, the etching liquid in the etching liquid tank 15B is supplied to the outer bath 10b of the processing bath 10 via a connection line 15b provided with a valve $V_3$. Further, a flow rate control mechanism 39 is attached to the connection line 15b of the etching liquid tank 15B.

Meanwhile, the filter 23a of the circulation line 20 is connected with a branch line 31 provided with a valve $V_9$, and the branch line 31 is connected to the outer bath 10b. Further, the filter 23b is connected with a branch line 32, and the branch line 32 is connected to the outer bath 10b.

Further, branch lines 26 and 27 are sequentially connected to the downstream side of the filter 23b of the circulation line, and the branch lines 26 and 27 are merged to the branch line 32 connected to the outer bath 10b. In this case, the branch line 26 is sequentially provided with a flow rate meter 26a and an elution component measuring unit 26b, and the branch line 27 is sequentially provided with a flow rate meter 27a and a concentration measuring unit 27b.

The elution component measuring unit 26b measures the concentration of the silicon elution component in the etching liquid E provided for the etching processing, using a refractive index of light, and the concentration measuring unit 27b measures the concentration of the etching liquid E, particularly, the concentration of the phosphoric acid aqueous solution, using a refractive index of light.

Further, as illustrated in FIG. 1, a deionized water (DIW) source 40 is provided to supply DIW, the DIW source 40 is connected to the outer bath 10b of the processing bath 10 and the circulation line 20 via a connection line 40a provided with a flow rate control mechanism 41. In this case, a valve $V_{12}$ is attached to the connection line 40a, and the connection line 40a is diverged from the valve $V_{12}$ to be connected to both of the outer bath 10b and circulation line 20.

Further, the discharge unit (cooling tank) 30 is connected to the bottom portion of the inner bath 10a of the processing bath 10 via a connection line 33 provided with a valve $V_8$. Here, the discharge unit 30 is constituted by the cooling tank 30 that cools the etching liquid. The etching liquid taken out from the inner bath 10a is cooled by the cooling tank 30, and then discharged from a drain line 30a provided with a valve $V_{11}$.

Further, one end of a connection line 34 provided with a valve $V_{10}$ is connected to a point between the filter 23a and the filter 23b in the circulation line 20, and the other end of the connection line 34 is connected to the cooling tank 30.

Meanwhile, the elution component measuring unit 26b and the concentration measuring unit 27b are connected to a controller 100. Then, by the controller 100, the driving of each of the above-described functional parts, including the circulation pump 21 and the temperature controller 22 of the circulation line 20, the etching liquid tanks 15A and 15B, the high-Si-concentration phosphoric acid aqueous solution source 16A, the low-Si-concentration phosphoric acid aqueous solution source 16B, the flow rate control mechanisms 39 and 41, the cooling tank 30, the panel heater 11, and the respective valves $V_1$ to $V_{12}$, is controlled. The controller 100 may be realized by a general purpose computer as hardware and a program for executing the corresponding computer (e.g., a device control program or a processing recipe) as software. The software is stored in a storage medium such as, for example, a hard disk drive that is fixedly provided in a computer, or stored in a storage medium such as, for example, a CD ROM, DVD, or flash memory that is detachably set in a computer. Such a storage medium is denoted by a reference numeral 100a. A processor 100b retrieves a predetermined processing recipe from the storage medium 100a and executes the processing recipe, based on instructions from a user interface (not illustrated) as necessary. Thus, each of the functional parts of the etching apparatus is operated under the control of the controller 100, thereby performing a predetermined processing.

Next, descriptions will be made on an etching method performed by the controller 100 using the etching apparatus, with reference to FIGS. 2 to 4.

The high-Si-concentration phosphoric acid aqueous solution (the phosphoric acid aqueous solution having a high Si concentration) is first supplied from the high-Si-concentration phosphoric acid aqueous solution source 16A to the etching liquid tank 15A, and the low-Si-concentration phosphoric acid aqueous solution (the phosphoric acid aqueous solution having a Si concentration of zero) is then supplied from the low-Si-concentration phosphoric acid aqueous solution source 16B to the etching liquid tank 15B.

Subsequently, the etching liquid E (the high-Si-concentration phosphoric acid aqueous solution ($H_3PO_4$)) is supplied from the etching liquid tank 15A into the inner bath 10a of the processing bath 10, and the etching liquid in the inner bath 10a is caused to overflow, and then sent to outer bath 10b. Then, the circulation pump 21 is driven to circulate the etching liquid E overflowing to the outer bath 10b such that the etching liquid E is returned to the inner bath 10a through the circulation line 20. Then, the etching liquid E is heated by the temperature controller 22 to a predetermined temperature (100° C. to 180° C.) to be brought into a boiling state.

After the etching liquid E is heated to a boiling state, the etching liquid E in the inner bath 10a is maintained at a predetermined temperature capable of maintaining the boiling state, by adjusting the amount of heat applied to the etching liquid E in the circulation line 20 by the temperature controller 22.

Further, in order to perform an etching at a desired etching rate, it is necessary to maintain the etching liquid E at a predetermined concentration. Additionally, the temperature of the etching liquid E is maintained at a boiling temperature specific to the etching liquid E of the predetermined concentration.

When the etching liquid has a high Si concentration, the conventional seasoning time may be omitted or shortened.

In this state, the wafer W held vertically in a wafer boat (not illustrated) is accommodated in the inner bath 10a of the processing bath 10. The wafer W is immersed in the etching liquid E in the inner bath 10a for a predetermined period of time, and thus, etched. Thereafter, the wafer W is taken out from the processing bath 10. The etching processing is performed repeatedly. Therefore, the etching method includes a plurality of etching steps including, for example, a first etching step, a second etching step, and a third etching step, and interval steps between the steps (see, e.g., FIG. 2).

The etching step as used herein refers to a case where the wafer W is immersed in the etching liquid E in the inner bath 10a, and the interval step between etching steps refers to a case where the wafer W is not immersed in the etching liquid E in the inner bath 10a, that is, an interval from a time when an $n^{th}$ etching step is finished and a wafer W of one unit etching step is taken out from the inner bath 10a to a time when a wafer W of the next unit processing is immersed in the inner bath 10a in order to start the $(n+1)^{th}$ etching processing. In the interval steps between the plurality of etching steps, the etching liquid E is continuously circulated through the circulation line 20.

As the etching processing is performed, silicon (Si) is eluted from the wafer W to the etching liquid E in the inner bath 10a.

When the etching processing is performed repeatedly, silicon (Si) is eluted from the wafer W to the etching liquid E in the inner bath 10a, and when the concentration of the elution component in the etching liquid (Si concentration or silicon concentration) is too high, the property of the etching liquid is deteriorated.

In the present disclosure, the following control is performed to cope with the above-described case.

That is, in each etching step, the valve $V_8$ is first driven by the controller 100, so that the etching liquid E provided for the etching processing in the inner bath 10a is discharged to the cooling tank 30 side by a first set amount. The etching liquid E discharged into the cooling tank 30 is then discharged from the drain line 30a to the outside.

Simultaneously, the valve $V_3$ and the flow rate control mechanism 39 are driven by the controller 100, so that the low-Si-concentration phosphoric acid aqueous solution (a new etching liquid having a Si concentration of zero) is supplied from the etching liquid tank 15B into the outer bath 10b of the processing bath 10 by a second set amount.

Therefore, the etching liquid E in the processing bath 10 may be partially replaced by discharging the etching liquid E provided for the etching processing in the processing bath 10 by the first set amount and supplying the new etching liquid into the processing bath 10 by the second set amount.

Figure 2:
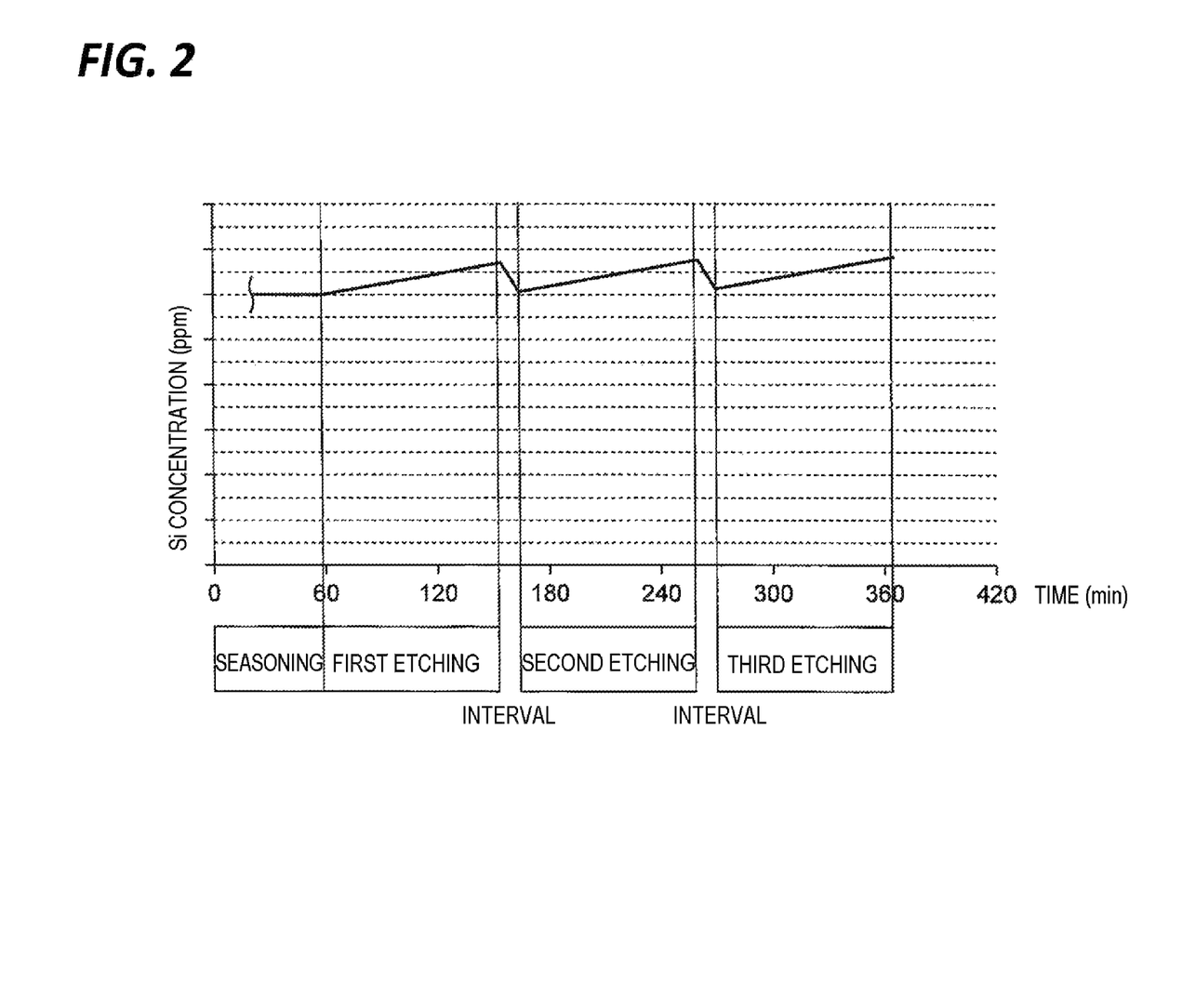
FIG. 2 is a view illustrating respective steps of the etching method of the present disclosure.

FIG. 2 illustrates the Si concentration of the etching liquid in a case of performing a first partial replacement pattern in which the etching liquid is discharged by the first set amount and supplied by the second set amount, in the first etching step, the second etching step, and the third etching step.

Figure 3:
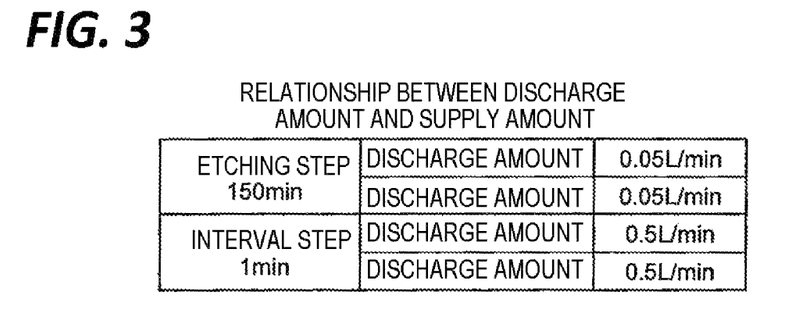
FIG. 3 is a view illustrating a relationship between a discharge amount and a supply amount in the etching method of the present disclosure.
Figure 4:
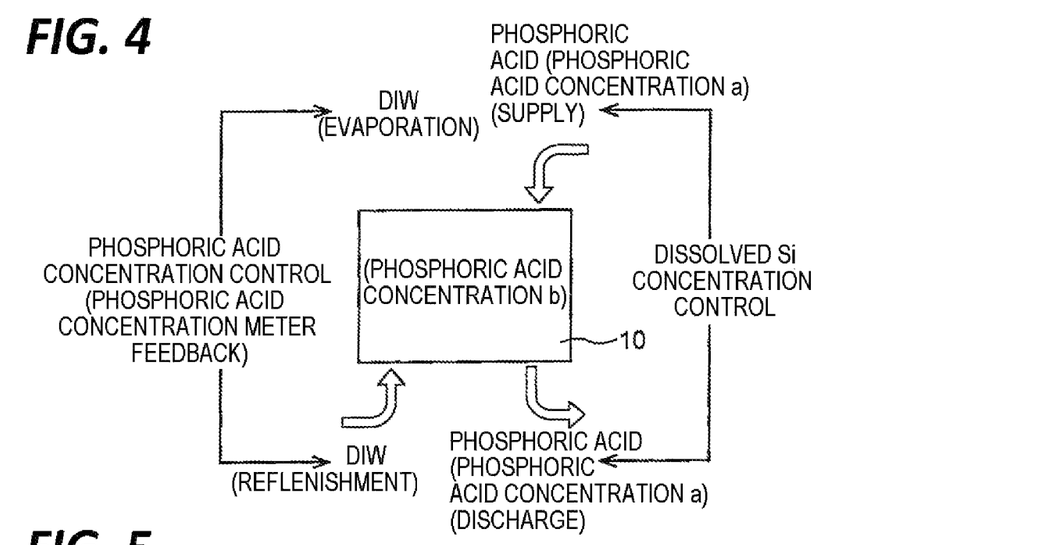
FIG. 4 is a view illustrating a control of a phosphoric acid concentration in the etching method of the present disclosure.

Specifically, in each etching step, the etching liquid in the processing bath 10, which is provided for the etching processing, is discharged by 0.05 L/min (the first set amount), and the new etching liquid is supplied into the processing bath 10 by 0.05 L/min (the second set amount) (see, e.g., FIG. 3).

Here, each etching step includes the first partial replacement pattern including a step of discharging the etching liquid in the processing bath 10 by the first set amount and a step of supplying the new etching liquid into the processing bath 10 by the second set amount. In the first partial replacement pattern, the etching liquid provided for the etching processing is continuously discharged over the whole period in the etching step, and the new etching liquid is continuously supplied over the whole period in the etching step.

In FIG. 2, the first partial replacement pattern is performed, but the Si concentration may be increased gradually so as not to exceed a predetermined Si concentration range in the etching step. The value of the Si concentration at the time of the completion of the etching step may be optionally changed depending on the wafer W to be subjected to the etching processing.

Subsequently, in the interval step between the etching steps, the valve $V_8$ is first driven by the controller 100, so that the etching liquid E provided for the etching processing in the inner bath 10a is discharged to the cooling tank 30 side by a third set amount. The etching liquid E discharged into the cooling tank 30 is then discharged from the drain line 30a to the outside.

Simultaneously, the valve $V_3$ and the flow rate control mechanism 39 are driven by the controller 100, so that the low-Si-concentration phosphoric acid aqueous solution (a new etching liquid having a Si concentration of zero) is supplied from the etching liquid tank 15B into the outer bath 10b of the processing bath 10 by a fourth set amount.

Therefore, the etching liquid E in the processing bath 10 may be partially replaced by discharging the etching liquid E provided for the etching processing in the processing bath 10 by the third set amount and supplying the new etching liquid into the processing bath 10 by the fourth set amount.

FIG. 2 illustrates the Si concentration of the etching liquid in a case of performing a second partial replacement pattern in which the etching liquid is discharged by the third set amount and is supplied by the fourth set amount, in the interval step between the first etching step and the second etching step, and the interval step between the second etching step and the third etching step.

Specifically, in each interval step, 0.5 L/min (the third set amount) of the etching liquid in the processing bath 10, which is provided for the etching processing, is discharged, and 0.5 L/min (the fourth set amount) of the new etching liquid is supplied into the processing bath 10 (see, e.g., FIG. 3).

Here, each etching step includes the second partial replacement pattern including a step of discharging the etching liquid in the processing bath 10 by the third set amount and a step of supplying the new etching liquid into the processing bath 10 by the fourth set amount. In the second partial replacement pattern, the etching liquid provided for the etching processing is continuously discharged over the whole period in the interval step, and the new etching liquid is continuously supplied over the whole period in the interval step.

Therefore, each interval step includes the second partial replacement pattern including a step of discharging the etching liquid in the processing bath 10 by the third set amount and a step of supplying the new etching liquid into the processing bath 10 by the fourth set amount.

The silicon concentration may be decreased to a predetermined value by the second partial replacement pattern of each interval step. Thus, the silicon concentration at the time of the start of the etching step immediately after the interval step may be returned to the same value as that at the time of the start of the etching step intermediately before the interval step.

However, in each etching step and interval step, deionized water (DIW) evaporates from the processing bath 10. At this time, DIW is replenished from the DIW source 40 to the outer bath 10b of the processing bath 10 or the circulation line 20, based on the value of the phosphoric acid concentration measured by the concentration measuring unit 27b, so that the phosphoric acid concentration in the processing bath 10 is constantly maintained (see, e.g., FIG. 4). In this case, when the etching liquid provided for the etching processing (for example, a phosphoric acid concentration b) is discharged from the processing bath 10 and a new etching liquid (for example, a phosphoric acid concentration a) is supplied into the processing bath 10, the phosphoric acid concentration in the processing bath 10 is changed due to the difference between the phosphoric acid concentration a and the phosphoric acid concentration b. Accordingly, it is also necessary to change the amount of the DIW to be replenished from the DIW source 40 to the outer bath 10b or the circulation line 20.

In the exemplary embodiment, in the first partial replacement pattern in each etching step, the etching liquid may be discharged based on a first set amount which is set such that the phosphoric acid concentration in the processing bath 10 becomes constant, and simultaneously, a new etching liquid may be supplied based on the second set amount which is set such that the phosphoric acid concentration in the processing bath 10 becomes constant.

Further, in the second partial replacement pattern in each etching step, the etching liquid may be discharged based on a third set amount which is set such that the phosphoric acid concentration in the processing bath 10 becomes constant, and similarly, a new etching liquid may be supplied based on the fourth set amount which is set such that the phosphoric acid concentration in the processing bath 10 becomes constant.

According to the exemplary embodiment as described above, each etching step includes the first partial replacement pattern in which the etching liquid provided for the etching processing in the processing bath 10 is discharged by the first set amount, and the new etching liquid is supplied into the processing bath 10 by the second set amount. Therefore, even though silicon is eluted from the wafer W to the etching liquid E during the etching step, an increase in the silicon concentration in the etching liquid E may be securely suppressed during the etching step.

Further, since each interval step includes the second partial replacement pattern in which the etching liquid provided for the etching processing in the processing bath 10 is discharged by the third set amount, and the new etching liquid is supplied into the processing bath 10 by the fourth set amount, the silicon concentration in the etching liquid E may be securely decreased during the interval step. In this case, by appropriately selecting the third set amount and the fourth set amount of the second partial replacement pattern of the interval step, the silicon concentration at the time of the start of the etching step immediately after the interval step may be returned to the same value as the silicon concentration at the time of the start of the etching step intermediately before the interval step.

Next, a comparative example of the present disclosure will be described with reference to FIG. 7. The comparative example illustrated in FIG. 7 includes a seasoning, a plurality of etching steps, and interval steps between the etching steps.

Figure 7:
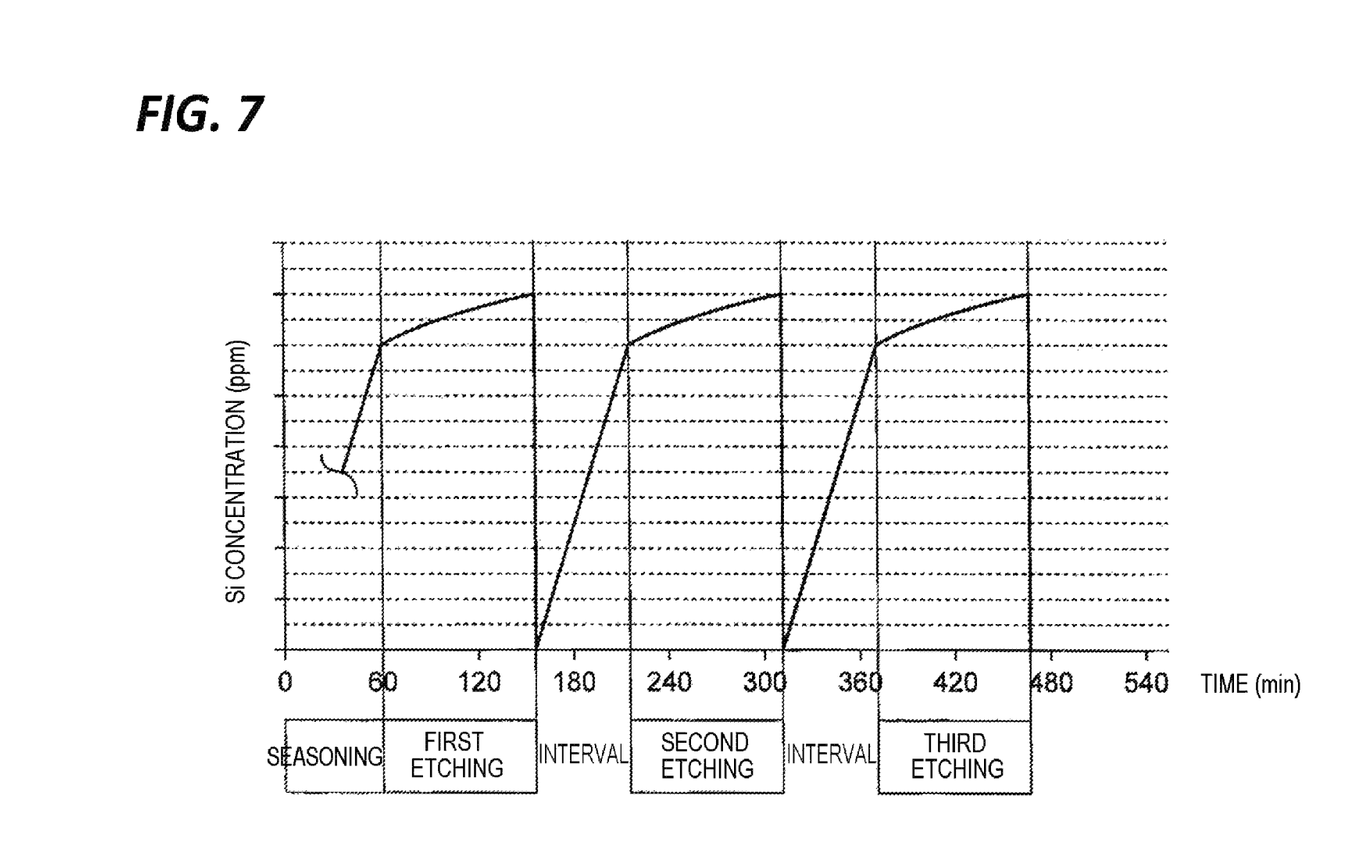
FIG. 7 is a schematic view illustrating an etching method as a comparative example.

As illustrated in FIG. 7, in each etching step, the etching processing is performed using an etching liquid on the wafer W in the processing bath without replacing the etching liquid. In addition, in each interval step, the etching liquid in the processing bath is completely replaced.

As illustrated in FIG. 7, since the etching liquid is not replaced in each etching step, the Si concentration is increased. Further, since the etching liquid is completely replaced in the interval step, similarly to the seasoning, a liquid adjustment is required in the interval step, and it takes a predetermined period of time for the liquid adjustment.

On the contrary, according to the present exemplary embodiment, when the etching liquid has a high Si concentration as illustrated in FIG. 2, the time for the liquid adjustment of the etching liquid, such as the first seasoning, may be omitted. Further, since the etching liquid is partially replaced by the first partial replacement pattern during the etching step, the increase in the Si concentration in the etching liquid may be suppressed during the etching step. In addition, since the etching liquid is partially replaced by the second partial replacement pattern during the interval step, the Si concentration in the etching liquid may be decreased during the interval step. Further, since the etching liquid is not completely replaced during the interval step, it is not necessary to perform the liquid adjustment of the etching liquid such as seasoning, thereby shortening the time of the interval step.

Modification

Next, a modification of the present disclosure will be described. The above-described exemplary embodiment was described with respect to an example in which the etching step includes a first partial replacement pattern, and the first partial replacement pattern includes a step of continuously discharging the etching liquid provided for the etching processing by a first set amount and a step of continuously supplying a new etching liquid by a second set amount (see, e.g., FIG. 2), but without being limited thereto, the first partial replacement pattern may include a step of intermittently discharging the etching liquid by the first set amount and a step of intermittently supplying a new etching liquid by the second set amount (see, e.g., the solid line in FIG. 5). In this case, the etching liquid discharge step and the new etching liquid supply step are performed at the same time.

Figure 5:
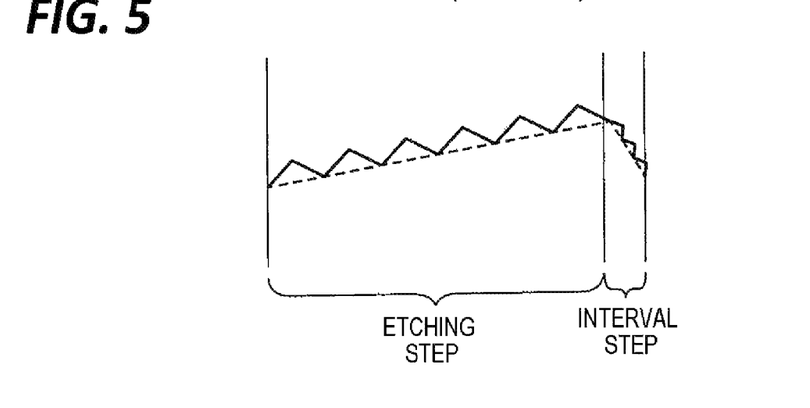
FIG. 5 is a view illustrating a modification of the etching method of the present disclosure.
Figure 6:
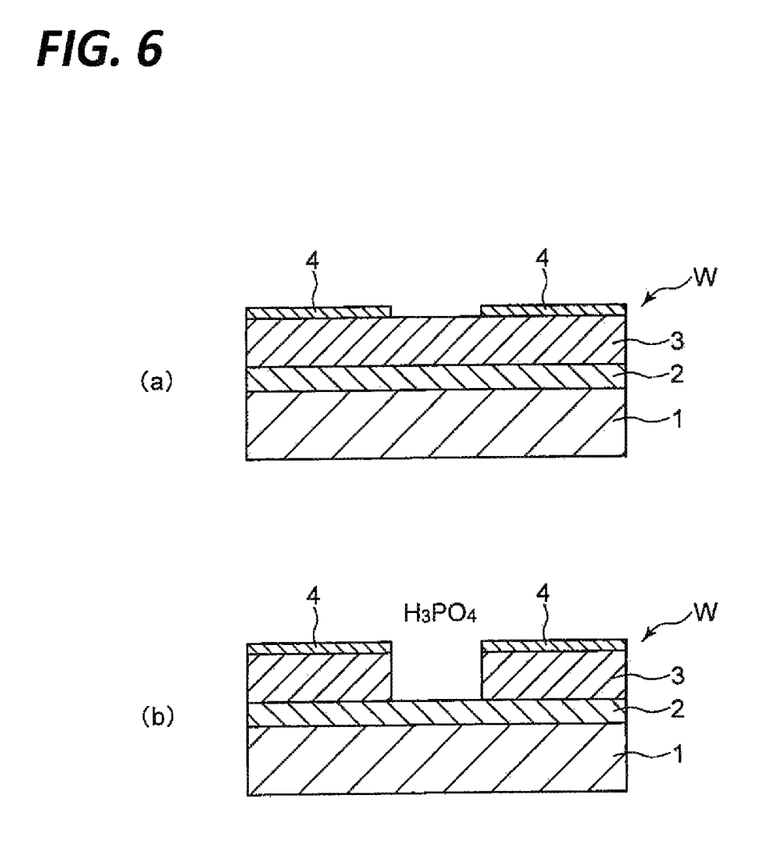
FIG. 6(a) is a view illustrating a wafer before the etching processing is performed.
FIG. 6(b) is a view illustrating a wafer after the etching processing is performed.

Further, the above-described exemplary embodiment was described with respect to an example in which the interval step includes a second partial replacement pattern, and the second partial replacement pattern includes a step of continuously discharging the etching liquid provided for the etching processing by a third set amount and a step of continuously supplying a new etching liquid by a fourth set amount (see, e.g., FIG. 2), but without being limited thereto, the third partial replacement pattern may include a step of intermittently discharging the etching liquid by the third set amount and a step of intermittently supplying a new etching liquid by the fourth set amount (see, e.g., the solid line in FIG. 5). In this case, the etching liquid discharge step and the new etching liquid supply step are performed at the same time.

Si Concentration Adjustment of Low-Si-Concentration Phosphoric Acid Aqueous Solution In the above-described exemplary embodiment, a low-Si-concentration phosphoric acid aqueous solution (a phosphoric acid aqueous solution having a Si concentration of zero) is supplied from the low-Si-concentration phosphoric acid aqueous solution source 16B to the etching liquid tank 15B, but not limited thereto. The Si concentration of the low-Si-concentration phosphoric acid aqueous solution may be adjusted by supplying a Si solution from the Si solution tank 18 to the etching liquid tank 15B as necessary.

Pattern of Supplying Combination of Si Solution and Low-Si-Concentration Phosphoric Acid Aqueous Solution to Inner Bath 10a In the above-described exemplary embodiment, the high-Si-concentration phosphoric acid aqueous solution (the phosphoric acid aqueous solution having a high Si concentration) is first supplied from the high-Si-concentration phosphoric acid aqueous solution source 16A to the etching liquid tank 15A, and the low-Si-concentration phosphoric acid aqueous solution (the phosphoric acid aqueous solution having a Si concentration of zero) is then supplied from the low-Si-concentration phosphoric acid aqueous solution source 16B to the etching liquid tank 15B. However, without being limited thereto, the low-Si-concentration phosphoric acid aqueous solution (the phosphoric acid aqueous solution having a Si concentration of zero) is supplied from the low-Si-concentration phosphoric acid aqueous solution source 16B to the etching liquid tank 15B, and the Si solution is supplied from the Si solution tank 18 to the etching liquid tank 15B, so that the low-Si-concentration phosphoric acid aqueous solution is adjusted to have an increased Si concentration and is supplied to the inner bath 10a, and the high-Si-concentration phosphoric acid aqueous solution source 16A functions as the low-Si-concentration phosphoric acid aqueous solution source 16B to thereby supply the high-Si-concentration phosphoric acid aqueous solution to the outer bath 10b.

DESCRIPTION OF SYMBOLS

W: semiconductor wafer (workpiece)
E: etching liquid
10: processing bath
10a: inner bath
10b: outer bath
11: panel heater
12: nozzle
15: supply unit
15A: etching liquid tank
15B: etching liquid tank
16A: high-Si-concentration phosphoric acid aqueous solution source
16B: low-Si-concentration phosphoric acid aqueous solution source
18: Si solution tank
19: Si solution source
20: circulation line
21: circulation pump
22: temperature controller
23a: filter
23b: filter
26b: elution component measuring unit
27b: concentration measuring unit
30: cooling tank
40: DIW source

What is claimed is:

1. An etching method comprising:
an etching step of performing an etching processing using an etching liquid on a workpiece accommodated in an etching processing unit; and
an interval step between the etching step on the workpiece and a next etching step on another workpiece,
wherein the etching step includes a first partial replacement pattern including discharging the etching liquid in the etching processing unit provided for the etching processing by a first set amount, and supplying a new etching liquid into the etching processing unit by a second set amount,
the interval step includes a second partial replacement pattern including discharging the etching liquid in the etching processing unit provided for the etching processing by a third set amount, and supplying a new etching liquid into the etching processing unit by a fourth set amount, and
the second partial replacement pattern of the interval step includes the third set amount and the fourth set amount which are set such that a concentration of an elution component in the etching liquid eluted from the workpiece provided for the etching processing when starting the etching step immediately after the interval step, is returned to a predetermined value.

2. The etching method of claim 1, wherein the first partial replacement pattern of the etching step includes continuously discharging the etching liquid in the etching processing unit provided for the etching processing by the first set amount, and continuously supplying a new etching liquid by the second set amount.

3. The etching method of claim 1, wherein the first partial replacement pattern of the etching step includes intermittently discharging the etching liquid in the etching processing unit provided for the etching processing by the first set amount, and intermittently supplying a new etching liquid by the second set amount.

4. The etching method of claim 1, wherein the second partial replacement pattern of the interval step includes continuously discharging the etching liquid in the etching processing unit provided for the etching processing by the third set amount, and continuously supplying a new etching liquid by the fourth set amount.

5. The etching method of claim 1, wherein the second partial replacement pattern of the interval step includes intermittently discharging the etching liquid in the etching processing unit provided for the etching processing by the third set amount, and intermittently supplying a new etching liquid by the fourth set amount.

6. The etching method of claim 1, wherein the first partial replacement pattern of the etching step includes the first set value and the second set value which are set such that a concentration of the etching liquid of the etching processing unit becomes constant, and the second partial replacement pattern of the interval step includes the third set value and the fourth set value which are set such that a concentration of the etching liquid of the etching processing unit becomes constant.

7. An etching apparatus for performing an etching processing on a workpiece, the device comprising:
an etching processing unit configured to accommodate the workpiece and perform the etching processing with an etching liquid;
a discharge unit configured to discharge the etching liquid provided for the etching processing in the etching processing unit;
a supply unit configured to supply a new etching liquid to the etching processing unit; and
a controller configured to control driving of the etching processing unit, the discharge unit, and the supply unit to thereby perform an etching method,
wherein the etching method performed by the controller includes:
an etching step of performing an etching processing using an etching liquid on a workpiece accommodated in an etching processing unit; and
an interval step between the etching step on the workpiece and a next etching step on another workpiece,
the etching step includes a first partial replacement pattern including discharging the etching liquid in the etching processing unit provided for the etching processing by a first set amount, and supplying a new etching liquid into the etching processing unit by a second set amount,
the interval step includes a second partial replacement pattern including discharging the etching liquid in the etching processing unit provided for the etching processing by a third set amount, and supplying a new etching liquid into the etching processing unit by a fourth set amount, and the second partial replacement pattern of the interval step includes the third set amount and the fourth set amount which are set such that a concentration of an elution component in the etching liquid eluted from the workpiece provided for the etching processing when starting the etching step immediately after the interval step, is returned to a predetermined value.

8. The etching apparatus of claim 7, wherein the first partial replacement pattern of the etching step includes continuously discharging the etching liquid in the etching processing unit provided for the etching processing by the first set amount, and continuously supplying a new etching liquid by the second set amount.

9. The etching apparatus of claim 7, wherein the first partial replacement pattern of the etching step includes intermittently discharging the etching liquid in the etching processing unit provided for the etching processing by the first set amount, and intermittently supplying a new etching liquid by the second set amount.

10. The etching apparatus of claim 7, wherein the second partial replacement pattern of the interval step includes continuously discharging the etching liquid in the etching processing unit provided for the etching processing by the third set amount, and continuously supplying a new etching liquid by the fourth set amount.

11. The etching apparatus of claim 7, wherein the second partial replacement pattern of the interval step includes intermittently discharging the etching liquid in the etching processing unit provided for the etching processing by the third set amount, and intermittently supplying a new etching liquid by the fourth set amount.

12. The etching apparatus of claim 7, wherein the first partial replacement pattern of the etching step includes the first set value and the second set value which are set such that a concentration of the etching liquid of the etching processing unit becomes constant, and the second partial replacement pattern of the interval step includes the third set value and the fourth set value which are set such that a concentration of the etching liquid of the etching processing unit becomes constant.

13. A non-transitory computer-readable storage medium that stores a computer program for performing an etching method,
wherein the etching method includes:
an etching step of performing an etching processing using an etching liquid on a workpiece accommodated in an etching processing unit; and
an interval step between the etching step on the workpiece and a next etching step on another workpiece,
the etching step includes a first partial replacement pattern including discharging the etching liquid in the etching processing unit provided for the etching processing by a first set amount, and supplying a new etching liquid into the etching processing unit by a second set amount,
the interval step includes a second partial replacement pattern including discharging the etching liquid in the etching processing unit provided for the etching processing by a third set amount, and supplying a new etching liquid into the etching processing unit by a fourth set amount, and
the second partial replacement pattern of the interval step includes the third set amount and the fourth set amount which are set such that a concentration of an elution component in the etching liquid eluted from the workpiece provided for the etching processing when starting the etching step immediately after the interval step, is returned to a predetermined value.

* * * * *